United States Patent
Miura et al.

(10) Patent No.: US 7,667,472 B2
(45) Date of Patent: Feb. 23, 2010

(54) PROBE ASSEMBLY, METHOD OF PRODUCING IT AND ELECTRICAL CONNECTING APPARATUS

(75) Inventors: Kiyotoshi Miura, Aomori (JP);
Hidehiro Kiyofuji, Saitama (JP); Yuji Miyagi, Aomori (JP); Shinji Kuniyoshi, Tokyo (JP); Hitoshi Sato, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 131 days.

(21) Appl. No.: 11/912,872

(22) PCT Filed: May 23, 2005

(86) PCT No.: PCT/JP2005/009812
§ 371 (c)(1),
(2), (4) Date: Oct. 26, 2007

(87) PCT Pub. No.: WO2006/126279
PCT Pub. Date: Nov. 30, 2006

(65) Prior Publication Data
US 2009/0058440 A1    Mar. 5, 2009

(51) Int. Cl.
*G01R 31/02* (2006.01)
*G01R 31/26* (2006.01)

(52) U.S. Cl. .................... 324/754; 324/757; 324/758; 439/74

(58) Field of Classification Search ......... 324/754–765; 439/74
See application file for complete search history.

(56) References Cited

U.S. PATENT DOCUMENTS

| 5,412,329 | A * | 5/1995 | Iino et al. ................. 324/754 |
| 7,468,610 | B2 * | 12/2008 | Miyagi et al. ............. 324/754 |
| 2005/0156613 | A1 * | 7/2005 | Hosaka ..................... 324/754 |
| 2006/0082380 | A1 * | 4/2006 | Tanioka et al. ............ 324/754 |

FOREIGN PATENT DOCUMENTS

| JP | 10-031034 | 2/1998 |
| JP | 2003-179110 | 6/2003 |
| JP | 2003-203954 | 7/2003 |
| WO | WO 96/15458 | 5/1996 |
| WO | WO 01/71779 A2 | 9/2001 |
| WO | WO 03/062837 A1 | 7/2003 |
| WO | WO 2006/126279 A1 | 11/2006 |

\* cited by examiner

*Primary Examiner*—Ha Tran T Nguyen
*Assistant Examiner*—Emily Y Chan
(74) *Attorney, Agent, or Firm*—Ingrassia Fisher & Lorenz, P.C.

(57) ABSTRACT

A probe assembly for use in electrical measurement of a device under test. The probe assembly comprises a plate-like probe base plate with bending deformation produced in a free state without load, and a plurality of probes formed on one face of the probe base plate to project from the face. All the tips of the probes are positioned on the same plane parallel to an imaginary reference plane of the probe base plate.

8 Claims, 13 Drawing Sheets

PROBE ASSEMBLY, METHOD OF PRODUCING IT AND ELECTRICAL CONNECTING APPARATUS

FIELD OF ART

The present invention relates to an electrical connecting apparatus such as a probe card for use in connection between an electric circuit of an integrated circuit such as a device under test and an electric circuit of a tester for an electrical test thereof, a probe assembly to be used for the electrical connecting apparatus and a method of producing the probe assembly.

BACKGROUND OF THE ART

As a conventional electrical connecting apparatus of this kind, an electrical connecting apparatus having a probe assembly in which a probe base plate as well as a plurality of probes extending from the probe base plate are provided has been proposed (See Patent Document 1). This conventional electrical connecting apparatus can act pressure or tensile force from a supporting member supporting the probe base plate on a part of the probe base plate. Even if a bend is produced in the probe base plate of the probe assembly, the bending deformation of the probe base plate can be modified by the adjustment of this action, thereby maintaining the flatness of the probe base plate.

In producing a probe assembly, therefore, even if a bending deformation is produced in the probe base plate where probes are to be provided, the above-mentioned adjusting work after assembling the probe assembly into the electrical connecting apparatus enables to keep the probe base plate flat, so that the multiple probe tips extending from the probe base plate can be maintained on the same plane. This enables all the probe tips to surely contact an electrical connecting terminal corresponding to each of the above-mentioned probes of the electric circuit of the device under test, thereby obtaining a favorable electrical contact therebetween.

According to the conventional art described in Patent Document 1, however, it is necessary, at the time of assembling the probe card assembly into the electrical connecting apparatus, to adjust so that all the probe tips may be positioned on the same plane according to the bending deformation introduced into each probe base plate every time the probe card assembly is assembled into the electrical connecting apparatus. The work of adjusting to make all the probe tips contact properly with each corresponding electrical connecting terminal of the device under test is complicated and requires skill. Particularly, in testing of numerous integrated circuits formed on a semiconductor wafer, since the number of probes of the probe assembly remarkably increases, it is not easy to adjust to make such numerous probes contact properly each corresponding pad on the semiconductor wafer. Moreover, since such adjustment is necessitated every time probe assemblies are exchanged, there has been a strong desire to dispense with such adjustment.

[Patent Document 1] National Patent Public Disclosure No. 2003-528459 Official Gazette

BRIEF SUMMARY

An object of the present invention is to provide a probe assembly, a method of producing it, and an electrical connecting apparatus, which dispenses with any adjustment to flatten a probe base plate after assembling a probe assembly into an electric connecting apparatus regardless of any deformation of the probe base plate, and which can ascertain an electrical connection between probes and a corresponding electrical connecting terminal of a device under test of a corresponding electric circuit.

The probe assembly according to the present invention is a probe assembly for use in electrical measurement of a device under test, and comprises a plate-like probe base plate with bending deformation produced in a free state without load, and a plurality of probes formed in one face of the probe base plate to project from the face, and all the probe tips are positioned on the same plane parallel to an imaginary reference plane of the probe base plate with the deformation maintained.

In the probe assembly according to the present invention, the plural probes are set so as to be positioned on the same plane parallel to the imaginary reference plane with the deformation of the probe base plate maintained. Therefore, so long as the probe assembly is assembled into a predetermined position with the bending deformation of the probe base plate maintained, all the probe tips can be pressed substantially uniformly against each electrical connecting terminal of the electric circuit which is a device under test, without doing any complicated work for flattening the probe base plate. This enables to connect all the probes of the probe assembly with the corresponding electrical connecting terminal of the device under test.

The probe base plate can be formed by a base plate member and a wiring layer formed on one face of the base plate member and a wiring layer having a plurality of electrical connecting portions on the surface. In this case, the probes are formed in the electrical connecting portions of the wiring layer to project in the direction to be away from the base plate member.

A ceramic plate can be used for this base plate member. Because of heat resistance and insurability, the ceramic plate supports the wiring layer suitably.

The wiring layer may be a multi-layered wiring layer. The multi-layered wiring layer of this probe base plate is advantageous for disposing plural probes corresponding to a fine circuit such as an integrated circuit in the probe base plate at a high density.

It is possible to form on the other face of the ceramic plate a plurality of anchor portions having female screw holes respectively receiving the ends of plural male screw members for attaching the probe base plate to a predetermined positions and make the top faces of all the anchor portions on the same plate parallel to the imaginary reference plane of the probe base plate with the deformation maintained.

By aligning the top faces of the anchor portions, dispersion is caused in the height dimension of each anchor portion according to the deformation of the ceramic plate, that is, the deformation of the probe base plate. However, in case of disposing, for example, a spacer member between the top portion of each anchor and a mounting face by means of the male screw member, the probe assembly can be properly mounted on a flat reference mounting face of the electrical connecting apparatus with the deformation of the probe base plate maintained, by aligning the top face positions of the anchor portions as mentioned above by use of the spacer members of the same length, so that various kinds of spacer members having different lengths corresponding to the deformation of the probe base plate are dispensed with.

A plurality of probe lands for the probes can be formed in the electrical connecting portions to be formed on the surface of the multi-layered wiring layer to project in a direction to be away from the ceramic plate. Each of the probes extends from the end face of each projecting probe land. With the deformation of the probe base plate maintained as it is, the end faces of all the probe lands can be positioned on the same plane parallel to the imaginary reference plane. Thus, by aligning the end faces of all the probe lands, if probes having the same height dimension, namely, the same length dimension are formed in the end faces of respective probe lands, the front end positions of all the probes can be aligned on the same plane. Accordingly, regardless of the deformation of the probe base plate, instead of using probes of different lengths according to the deformation, probes of an equal length can be used, thereby simplifying the production process of the probes.

The method of producing the probe assembly according to the present invention comprises: forming a multi-layered wiring layer on one of the faces of the base plate member as well as forming a plurality of probe lands on the surface of the multi-layered wiring layer; aligning the end faces of the probe lands in order in a state that any deformation introduced into the base plate member is held as it is, in order to position all the end faces of the probe lands on the same plane parallel to an imaginary reference plane regardless of any bending deformation of the base plate member; forming on the other face of the base plate member a plurality of anchor portions having screw holes into which the ends of the male screw members can be screwed; aligning the top faces of the anchor portions so as to position on the same plane parallel to the imaginary axis regardless of the bending deformation of the base plate member with the deformation of the base plate portion maintained; and forming probes of the same height on the aligned end faces of the probe lands.

In the method of producing the probe assembly according to the present invention, a multi-layered wiring layer is formed on one of the faces of the base plate member, and the probe lands are formed in relation to the formation of the multi-layered wiring layer. Also, the anchor portions are formed on the other face of the base plate member. Since these probe lands and anchor portions are aligned on the same planes, the top faces of all the anchor portions and all the probe tips are aligned on the planes parallel to the imaginary reference plane, regardless of any bending deformation of the base plate member, if any.

Consequently, since the probe base plate with all the probe tips aligned on the same plane and the top faces of all the anchor portions for attachment aligned on the same plane can be relatively easily produced regardless of any bending deformation of the base plate member, adjustment of the flatness of the base plate member is unnecessary, and yet the probe assembly which dispenses with various kinds of spacers different in length for attachment can be relatively easily formed.

By aligning the end faces of the probe lands and the top faces of the anchor portions after forming the multi-layered wiring layer, the top faces of all the anchor portions and all the probe tips can be aligned on the same planes, regardless of any bending deformation of the base plate member even if such bending deformation occurs to the base plate member made of, for example, a ceramic plate in a forming process of a multi-layered wiring.

After forming the plural probe lands on the surface of the multi-layered wiring layer to an equal height to each other, their end faces can be arranged to conform to the curve of the probe base plate. It is also possible to arrange the top faces to conform to the curve of the probe base plate after forming the anchor portions of the other face of the base plate to an equal height.

The ends of the probe lands and the anchor portions may be polished in order to align the end faces of the probe lands and the top faces of the anchor portions, respectively. Chemical mechanical polishing is applicable to this polishing. For this chemical mechanical polishing, a polishing machine with, e.g., a planar polishing face driven to rotate is used, which can efficiently align the top faces of the anchor portions and the end faces of the probe lands by pressing the ends of all the anchor portions or all the probe lands against this planar polishing face.

For the base plate member a ceramic plate similar to the above-mentioned one can be used, and the multi-layered wiring layer can be formed by using a photolithographic technique. By forming the multi-layered wiring layer, with the photolithographic technique, the probe assembly can be relatively easily miniaturized in correspondence with the miniaturization of a device under test.

In realizing the miniaturization, it is preferable to form cantilever-type probes by using the photolithographic technique and to secure the probes to the end faces of the probe lands. Otherwise, needle-type probes such as tungsten can be used as probes.

The electrical connecting apparatus according to the present invention is an electrical connecting apparatus for connecting a tester and electrical connection terminals of a device under test which is to undergo an electrical test by the tester comprises: a supporting member having a reference plane for mounting; a wiring base plate in which a wiring circuit to be connected to the tester is formed, of which one face is placed so as to oppose to the reference plane of the supporting member and a plurality of connection terminals of the wiring circuit are formed on the other face; a probe assembly having a plate-like probe base plate with a bending deformation produced in a free state without load and a plurality of probes capable of contacting the tip portions with the connection terminals of the device under test provided on one face of the probe base plate, the other face of the probe base plate being disposed opposite to the other face of the wiring base plate; an electrical connector disposed between the probe base plate and the wiring base plate so as to connect the connection terminals of the wiring base plate with the probe corresponding to the connection terminals; and a plurality of spacers to be arranged to fit between the other face of the probe base plate and the reference plate of the supporting member so as to keep the deformation of the probe base plate when the probe assembly is attached to the supporting member in order to connect the probes to the connection terminals of the wiring base plate through the electrical connector, the tip of each probe being disposed on the same plane with the deformation of the probe base plate maintained.

In the electrical connecting apparatus according to the present invention, the probe assembly is attached to the reference plane of the supporting member by the spacer inserted between the probe base plate of the probe assembly and the reference plane of the supporting member, the deformation being surely maintained, and in this state of attachment, all the probe tips are positioned on the same plane.

Therefore, without any adjusting work for flattening a probe base plate such as a conventional one after the probe assembly is attached to the supporting member, all the probe tips can be pressed substantially uniformly against each electrical connecting terminal of the electric circuit which is a device under test. Because of this, such complicated flattening adjustment as in conventional cases becomes unnecessary whenever the probe assemblies are exchanged, thereby realizing an efficient electrical test.

The probe base plate can be constituted by a ceramic plate and a multi-layered wiring layer formed on one face of the ceramic plate and having an electrical connecting portion on the surface, and the probes may be formed in the electrical connecting portion of the multi-layered wiring layer to project in a direction to be away from the ceramic plate.

The probe base plate can be attached to the supporting member through a screw member which is disposed, penetrating the supporting member, the wiring base plate and the electrical connector. In this case, the spacer can be constituted by a plurality of anchor portions which are formed on the other face of the ceramic plate and rising toward the reference plane of the supporting member and which have their top faces on the same plane parallel to the reference plane and having female screw holes for receiving the ends of the screw members, and a plurality of spacer members having a uniform length inserted between the top faces of the anchor portions and the reference plane.

Also, in place of this example, a spacer plate which permits the electrical connector to penetrate, combined with the supporting member and having a uniform thickness can be disposed between the probe base plate and the wiring base plate. In this case, the probe base plate is attached to the spacer plate through a male screw member disposed, penetrating through the spacer plate, and the spacer is constituted by: a plurality of anchor portions which are formed on the other face of the ceramic plate and rise toward the reference plate of the supporting member and which have top faces on the same plane parallel to the reference plane of the probe base plate and female screw holes formed for receiving the ends of the male screw members; and the spacer plate inserted between the top faces of the anchor portions and the reference plane. Also, in this case, a bolt with a head embedded in the spacer member between the wiring base plate and the spacer plate can be used.

It is also possible to attach a thermal deformation inhibitor to a plane opposite to the reference plane of the supporting member, the thermal deformation inhibitor having a coefficient of thermal expansion larger than that of the supporting member so as to restrain deflective deformation of the supporting member.

Since in this thermal deformation inhibitor one face becomes a mounting face on the supporting member having a coefficient of thermal expansion smaller than that of the thermal deformation inhibitor and the other face positioned on the opposite side becomes a free face, so that, when the thermal deformation extends by a rise in atmospheric temperature, a stress difference is caused between both the faces of the thermal deformation inhibitor. By using this stress difference, the deflective deformation of the central portion of the supporting member to which the thermal deformation inhibitor is attached can be restrained.

According to the probe assembly of the present invention, the plural probes provided in the probe base plate are set to be positioned on the same plane parallel to an imaginary reference plane of the probe base plate with the deformation maintained. Therefore, so long as the probe assembly is assembled into a predetermined position with the bending deformation of its probe base plate maintained, all the probe tips can be pressed substantially uniformly against each electrical connection terminal of the electric circuit which is a device under test, all the probes can be properly brought into contact with the electrical connection terminals of the corresponding device under test.

Also, according to the method of producing the probe assembly of the present invention, all the probe tips are aligned on the same plane regardless of any bending deformation of the base plate member, and the probe base plate, in which the top faces of all the anchor portions for attachment are aligned on the same plane, can be relatively easily produced, so that adjustment of flatness of the base plate member is not necessary, and yet, the probe assembly according to the present invention, which dispenses with various kinds of spacers for attachment, can be relatively easily formed.

Further, according to the electrical connecting apparatus of the present invention, the spacer inserted between the probe base plate of the probe assembly and the reference plane of the supporting member enables the probe base plate to be attached to the reference plane of the supporting member with the deformation surely maintained. Consequently, after the probe assembly is attached to the supporting member, all the probe tips can be pressed against the respective electrical connection terminals of the electric circuit as a device under test substantially uniformly without any adjustment work for flattening the probe base plate as heretofore. Therefore, every time the probe assemblies are exchanged, such complicated adjustment work for flattening the probe base plate as heretofore is no longer required, thereby enabling efficient electrical test.

BRIEF DESCRIPTION OF THE DRAWINGS

FIG. 9(a) through FIG. 9(g) are process drawings showing manufacturing processes of the probe assembly shown in FIG. 1, wherein FIG. 9(a) shows a state of the ceramic plate before the formation of the multi-layered wiring layer, FIG. 9(b) a formation process of the multi-layered wiring and the probe lands in the ceramic plate, FIG. 9(c) a polishing process of the probe lands, FIG. 9(d) a formation process of the anchor portions in the ceramic plate, FIG. 9(e) a polishing process of the anchor portions, FIG. 9(f) a state after polishing the probe lands and the anchor portions respectively, and FIG. 9(g) a mounting process of the probes on the probe lands.

Figure 1:
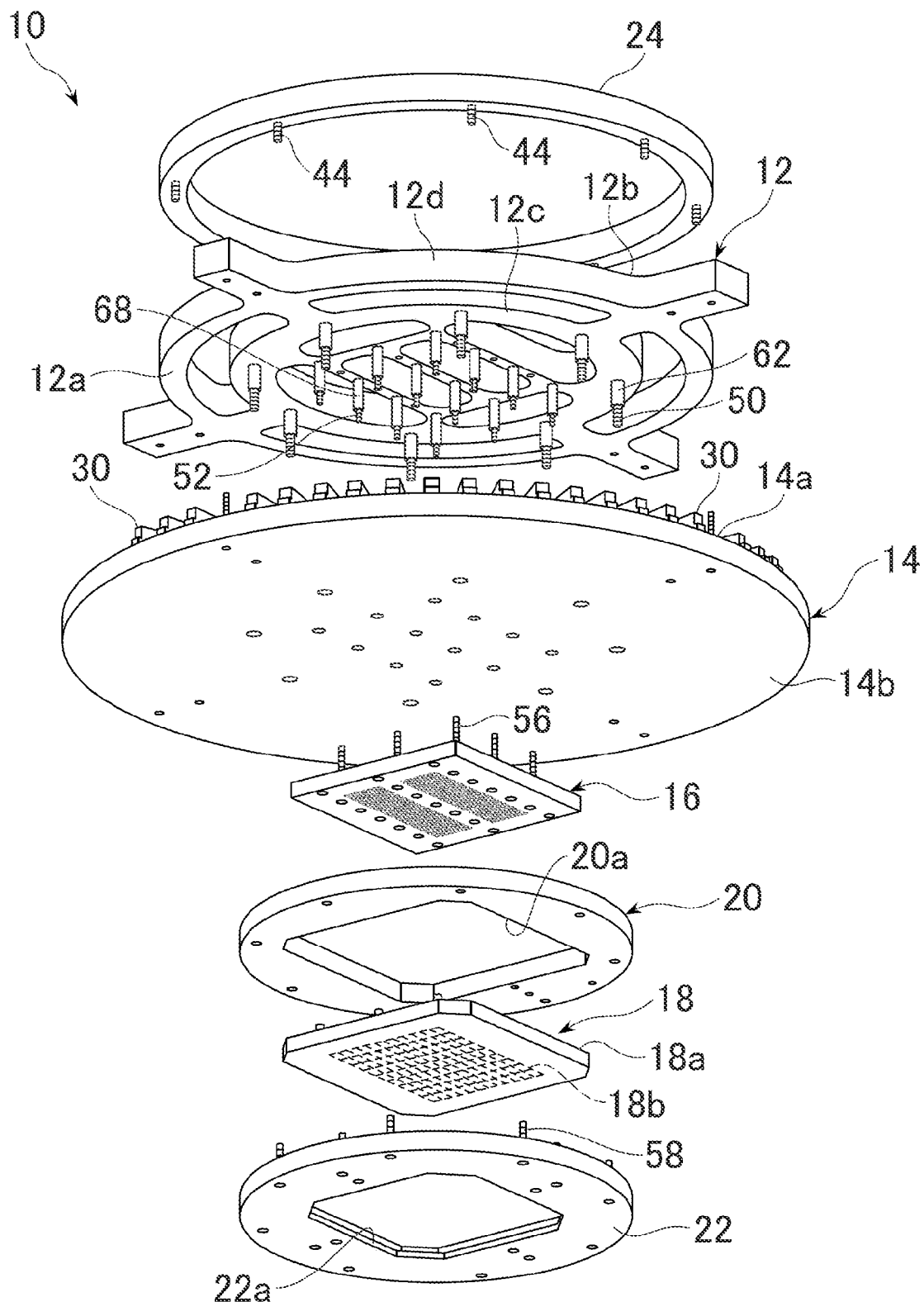
FIG. 1 is a perspective view showing in an exploded state one embodiment of the electrical connecting apparatus according to the present invention.

EXPLANATION OF REFERENCE NUMERALS 10 electrical connecting apparatus
12 supporting member
14 wiring base plate
16 electrical connector
18 probe assembly
18a probe base plate
18b probe
24 thermal deformation inhibitor
26 device under test (semiconductor wafer)
28 tester
34 base plate member (ceramic plate)
36 multi-layered wiring layer
36a wiring path of multi-layered wiring layer
40 probe land
64 female screw hole
66 anchor portion (anchor member)
68 spacer member
168 space plate

DETAILED DESCRIPTION

The electrical connecting apparatus 10 according to the present invention is shown in FIG. 1 in an exploded state. This electrical connecting apparatus 10 comprises: a flat plate-like supporting member 12, the underside 12a of which becomes a flat mounting reference plane; a circular flat plate-like wiring base plate 14 held by the mounting plane 12a of the supporting member; a probe assembly 18 electrically connected with the wiring base plate 14 through an electrical connector 16; a base ring 20 with a central opening 20a formed for receiving the electrical connector 16; and a securing ring 22 for sandwiching the edge portion of the probe assembly 18 in cooperation with the edge portion of the central opening 20a of the base ring. This securing ring 22 has in its central portion a central opening 22a permitting probes 18b mentioned later of the probe assembly 18 to be exposed. In the illustration, a thermal deformation inhibitor 24 for restraining a thermal deformation of the supporting member 12 which holds the wiring base plate 14 is attached to the supporting member 12.

Figure 2:
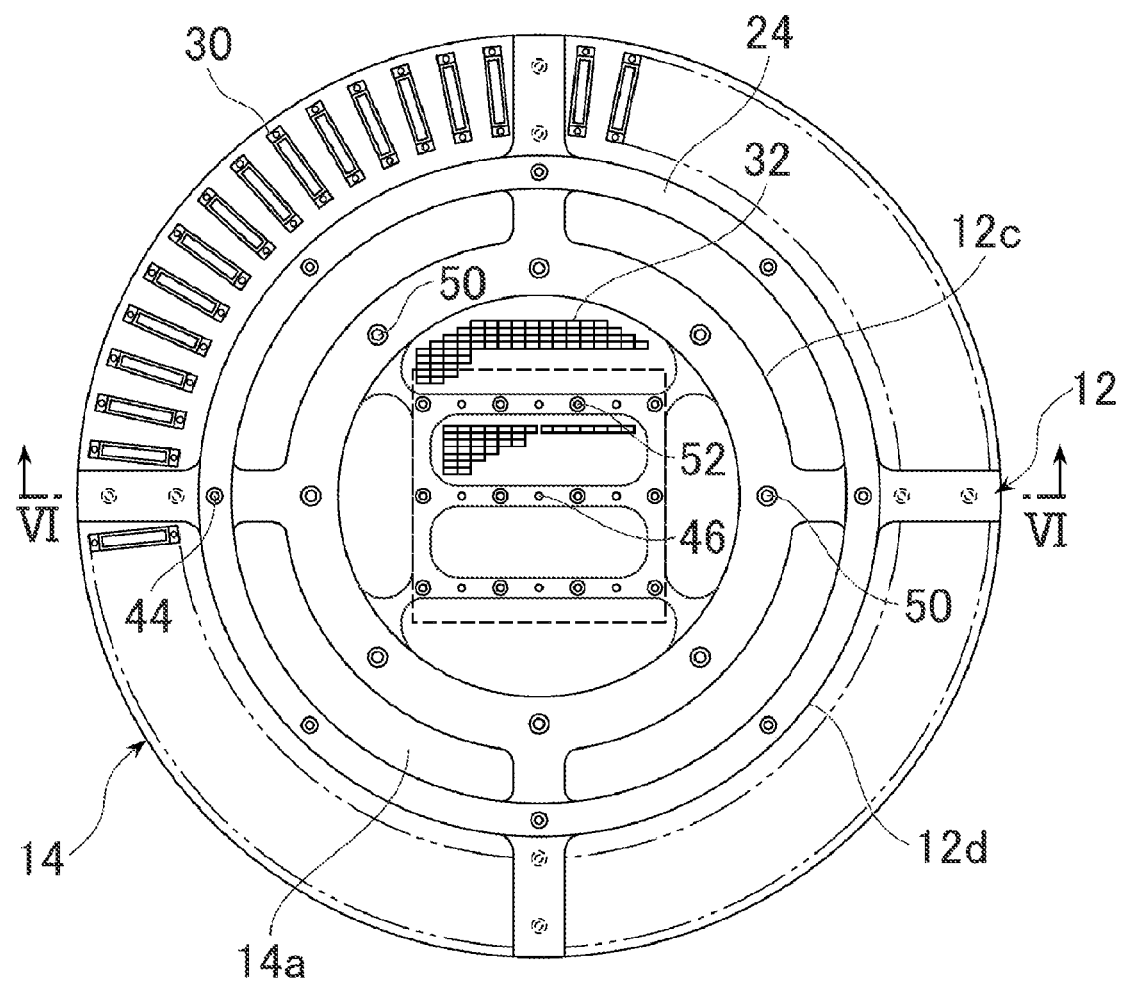
FIG. 2 is a top plan view of the electrical connecting apparatus shown in FIG. 1.
Figure 3:
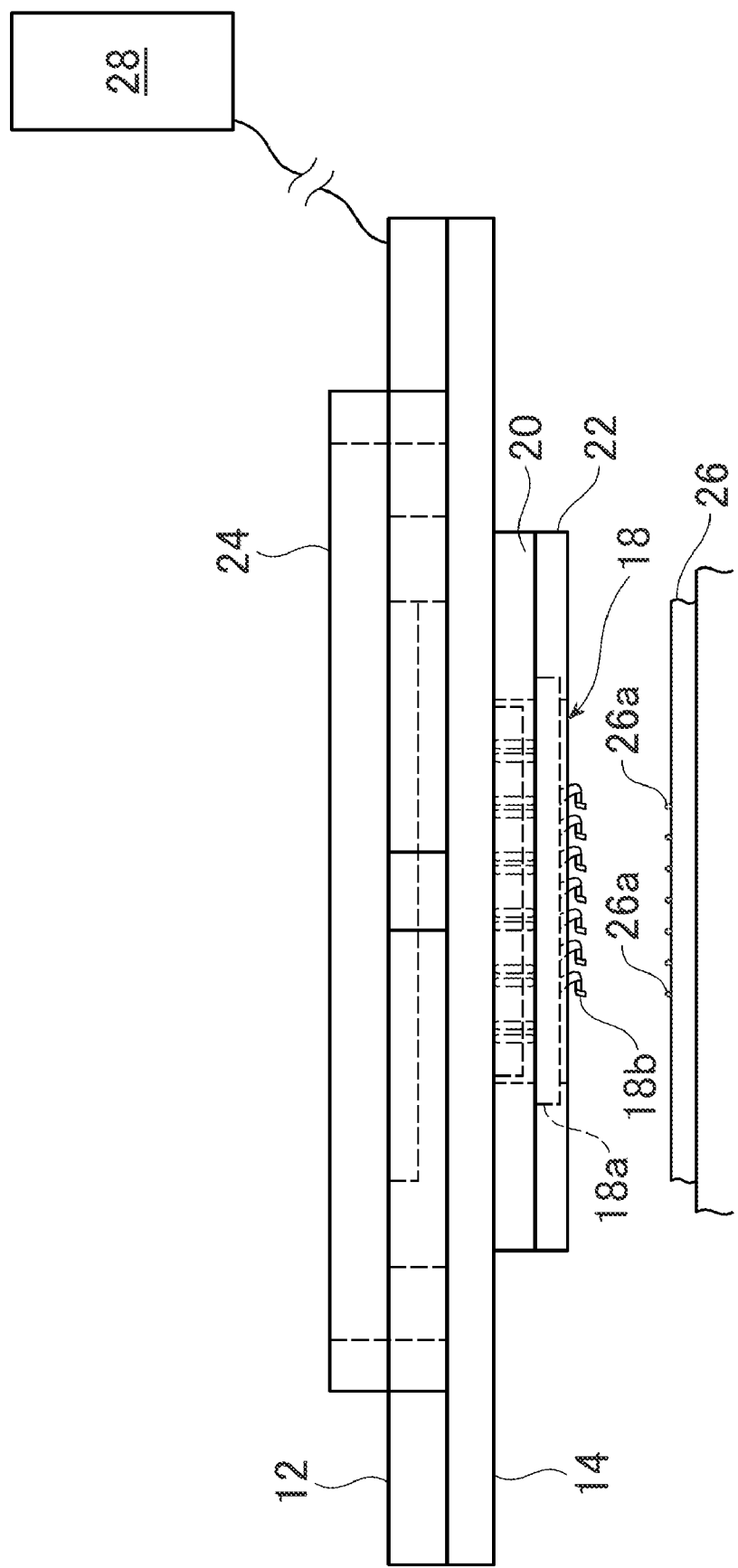
FIG. 3 is a front elevation of the electrical connecting apparatus shown in FIG. 1.
Figure 4:
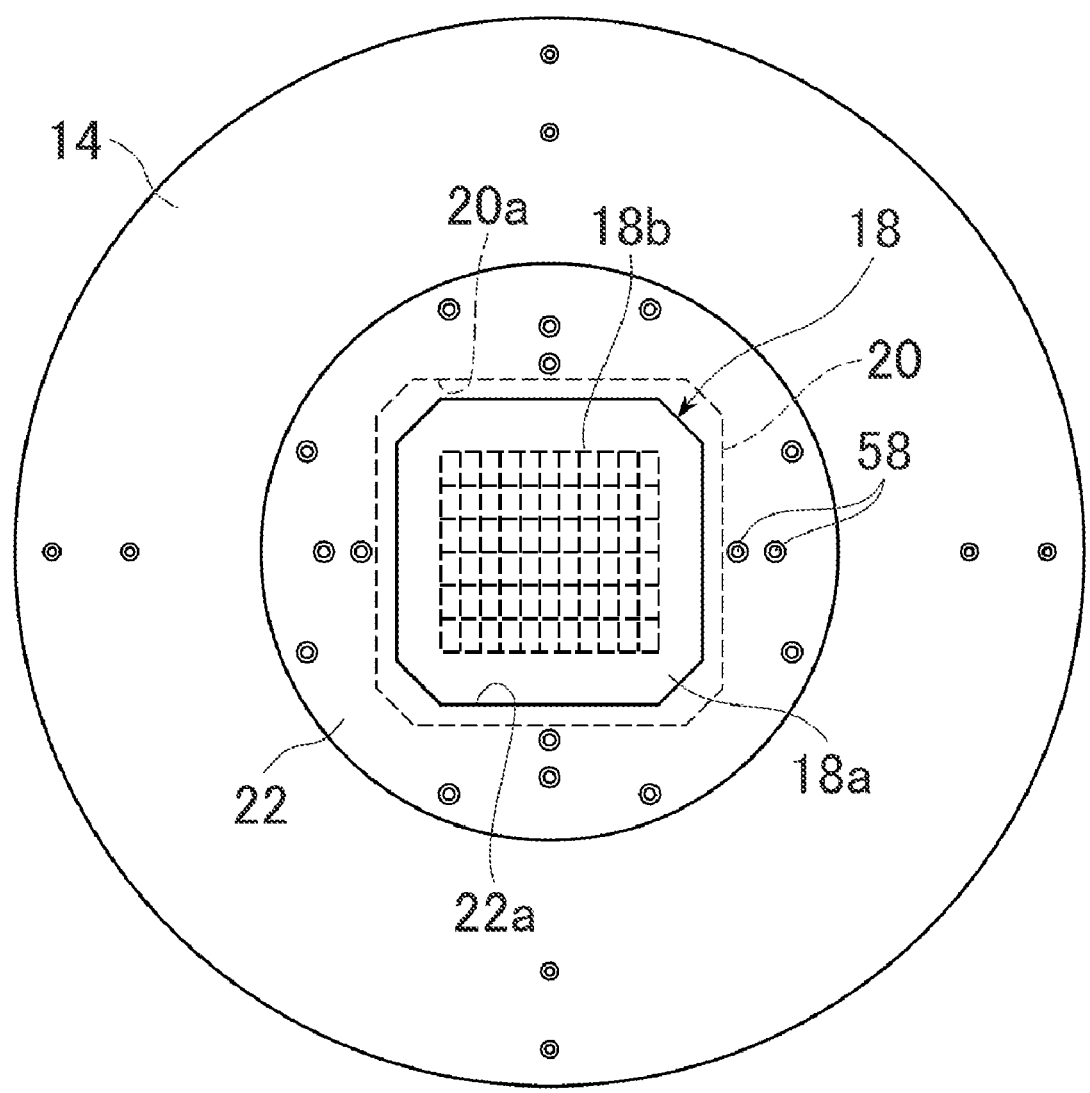
FIG. 4 is a bottom view of the electrical connecting apparatus shown in FIG. 1.

These members 12-24 are integrally assembled as shown in FIGS. 2-4, and are used for connecting each connecting pad 26a which is the connection terminal of the IC circuit with the electric circuit (not shown) of a tester 28 for electrical tests of a plurality of IC circuits (not shown) which are incorporated into a semiconductor wafer 26, for example, as shown in FIG. 3.

The wiring base plate 14 includes, in the illustration, a generally circular plate-like polyimide resin substrate, for example, polyimide resin substrate, and a plurality of connectors 30 to be connected with the electric circuit of the tester 28 are aligned annularly in the annular periphery of its top face 14a, as shown in FIG. 2. In the central portion of the underside 14b of the wiring base plate 14 (see FIG. 1), a plurality of connection terminals 14c corresponding to the connectors 30 (see FIG. 5) are arranged like a rectangular matrix. Each connector 30 and each connection terminal 14c can be electrically connected with each other through a not shown but heretofore well-known wiring circuit formed inside the polyimide resin substrate. Also, as shown in FIG. 2, in the central portion of the upper face 14a of the wiring base plate 14, a plurality of relays 32 for switching the connectors 30 and the connection terminals according to the contents of a test or for disconnecting the wiring circuit in case of emergency are arranged.

The supporting member 12 is a frame member made of, for example, a stainless plate which permits these connectors 30 and the relays 32 to be exposed, and the underside 12a (see FIG. 1) is placed to contact the upper face 14a of the wiring base plate 14. The supporting member 12, as clearly shown in FIG. 2, has an inward annular portion 12c surrounding the relays 32 and an outward annular portion 12d, and the connectors 30 are arranged in the outer periphery of the outward annular portion.

The thermal deformation inhibitor 24 is an annular member to be disposed to cover the outward annular portion 12d in the upper face 12b of the supporting member 12, and is made of a metal material such as aluminum.

Figure 5:
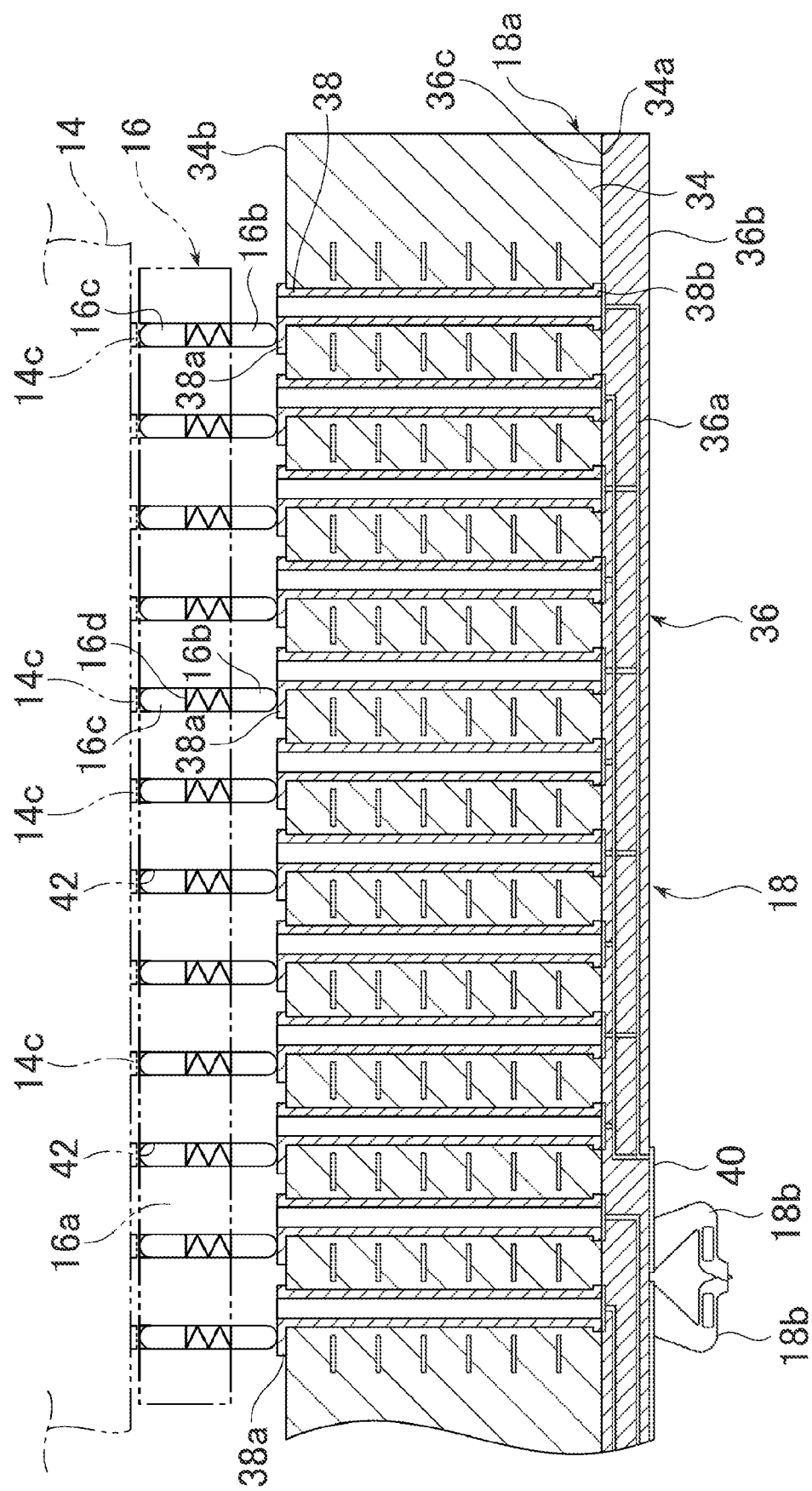
FIG. 5 is a sectional view of the probe base plate showing one example of relation of the electrical connection within the probe base plate of the probe assembly shown in FIG. 1.

The probe assembly 18 basically includes, as shown in FIG. 5, a probe base plate 18a, and a plurality of probes 18b formed on the underside of the probe base plate. The probe base plate 18a includes, as has been well known, for example, a base plate member 34 made of a ceramic plate, and a multi-layered wiring layer 36 formed on the underside 34a of the base plate member, i.e., the ceramic plate. The multi-layered wiring layer 36 has, as has been well known, a multi-layered plate made of an electrically insulating, e.g., a polyimide resin material, and wiring paths 36a formed among the multi-layered plates. Each probe 18b is formed to project downward from the underside 36b which is the surface of the multi-layered wiring layer 36. Each probe 18b is formed to project downward from the underside 36b which is the surface of the multi-layered wiring layer 36.

On the ceramic plate 34, a plurality of conductive paths 38 penetrating in its thickness direction are formed to correspond to the respective connection terminals 14c of the wiring base plate 14. On the upper face 34b of the ceramic plate 34 which becomes the upper face of the probe base plate 18a, connecting portions 38a formed at one end of each conductive path 38 is arranged and are connected with the corresponding connection terminals 14c of the wiring base plate 14 through the electrical connector 16. Also, on the underside 34a of the ceramic plate 34, the connecting portions 38b formed at the other end of each conductive path 38 are arranged. One end of each wiring path 36a of the multi-layered wiring layer 36 is connected with the corresponding connecting portion 38b of each conductive path 38 at the upper face 36c of the multi-layered wiring layer 36, and the other end of each wiring path 36a is connected with a probe land 40 formed on the underside of the probe assembly 18, namely, the underside 36b of the multi-layered wiring layer 36. A cantilever-type probe 18b is connected with each probe land 40, whereby each probe 18b is connected with the corresponding connection terminal 14c of the wiring base plate 14 at the upper face 34b of the probe base plate 18a through the electrical connector 16.

The electrical connector 16 includes, in the example shown in FIG. 5, a pogo pin block assembly 16a made of an electrically insulating plate-like member with a plurality of through holes 42 formed in the thickness direction, a pair of pogo pins 16b, 16c to be accommodated in series within each through hole 42 slidably in the axial direction of the through hole 42 such that each pogo pin is prevented from falling off the through hole 42. Between each pair of pogo pins 16b and 16c is disposed a helical coil spring 16d which gives both pogo pins 16b, 16c eccentric force in a direction to be away from each other to become a conductive path between both pogo pins. In an assembled state of the electrical connecting apparatus 10, one pogo pin 16c of each pair of pogo pins 16b, 16c is press-connected with the connecting portion 38a of the corresponding conductive path 38 by the spring force of the helical coil spring 16d of the electrical connector 16, while the other pogo pin 16c is press-connected with the corresponding connection terminal 14c of the wiring base plate 14, so that the probe 18b provided in each probe land 40 is connected with the corresponding connection terminal 14c of the wiring base plate 14. As a result, when the tips of the probes 18b are brought into contact with the connecting pads 26a of the semiconductor wafer 26 which is a device under test, the connecting pads are connected with the tester 28 through the corresponding connectors 30, thereby enabling an electrical test of the electrical circuit of the semiconductor wafer by the tester.

Figure 6:
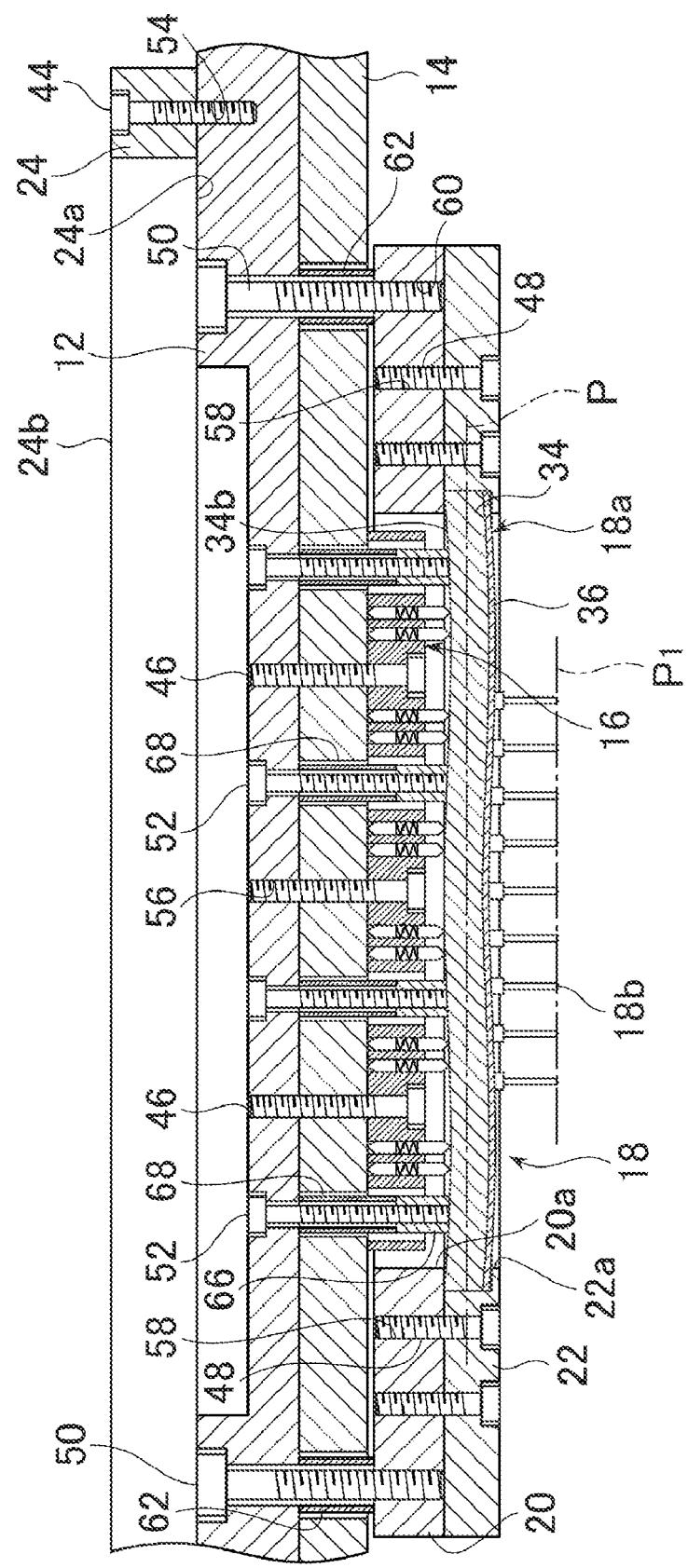
FIG. 6 is a sectional view showing in an expanded state a part of a section obtained along the line VI-VI in FIG. 2.

The foregoing electrical connecting apparatus 10 is assembled by bolts 44-52 which are a number of male screw members. That is, as shown in FIG. 6, the thermal deformation inhibitor 24 is secured to the upper face 12b of the supporting member 12 by the bolt 44 to be screwed into a female screw hole 54 formed in the supporting member 12. The electrical connector 16 is attached to this supporting member 12 with the bolt 46 disposed to penetrate the wiring base plate 14. The bolt 46, whose tip is screwed into the female screw hole 56 formed in the supporting member 12, sandwiches the wiring base plate 14 between the pogo pin block 16a of the electrical connector 16 and the supporting member 12.

Also, the base ring 20 and the securing ring 22 are combined with each other by the bolt 48 whose tip is screwed into a female screw hole 58 formed in the base ring 20, so as to sandwich the edge portion of the probe base plate 18a of the probe assembly 18. This base ring 20 is secured to the supporting member 12 by the bolt 50 whose tip is screwed into a female screw hole 60 formed in the base ring. The bolt 50 is inserted into a spacer 62 penetrating the wiring base plate 14 in its thickness direction. The spacer 62 maintains the base ring 20 and the securing ring 22 which sandwich the edge portion of the probe base plate 18a at a predetermined interval from the underside 12a which is a mounting face of the supporting member 12.

As mentioned above, the edge portion of the probe base plate 18a of the probe assembly 18 is sandwiched by the base ring 20 and the securing ring 22. When forming the conductive path 38 on the ceramic plate 34 which is the base plate member of the probe base plate 18a whose edge portion is sandwiched, or when forming a multi-layered wiring layer 36, for example, a sinuate bending deformation is sometimes produced in the flat ceramic plate 34 by the heat and external force in the process of production. Or, before forming the conductive path 38 and the multi-layered wiring layer 36, a bending deformation is sometimes produced in the ceramic plate 34 itself. The deformation of the probe base plate 18a due to such deformation of the base plate member 34 is maintained even in a free state where the external force does not act on the probe base plate.

In the probe assembly 18 according to the present invention, regardless of any deformation of such probe base plate 18a, the tips of all the probes 18b are prearranged so as to align on the same plane P1 in a free state with such deformation of the probe base plate 18a maintained. It is desirable to make this plane P1 parallel to an imaginary plane P of the flat ceramic plate which is obtained when there is no deformation produced in the ceramic plate 34 as the base member.

The probe assembly 18 with the probes 18b whose tips are aligned in such a manner is supported on the supporting member 12 through a plurality of bolts 52.

Figure 7:
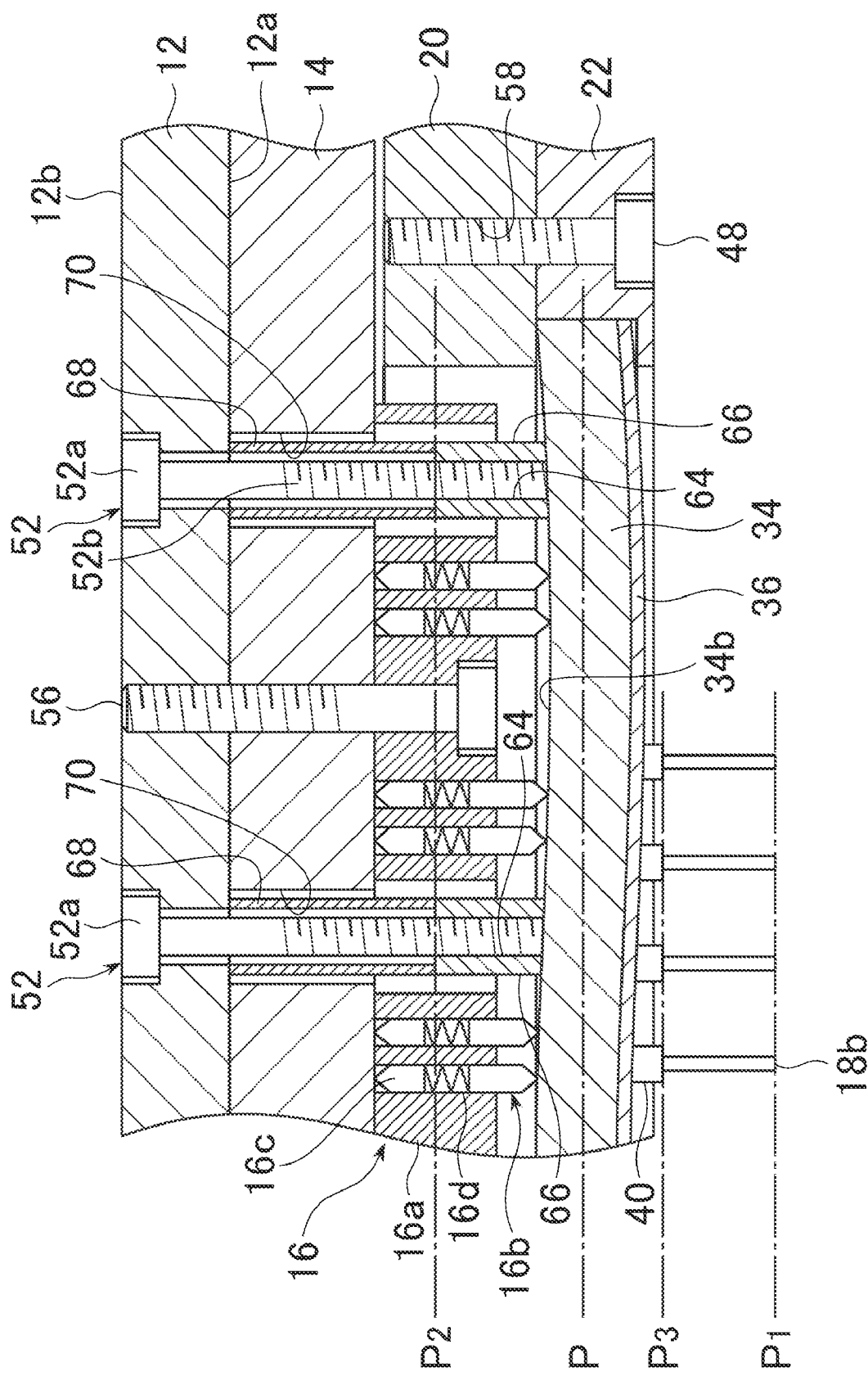
FIG. 7 is a sectional view showing a part of FIG. 6 in a further expanded state.

For the support by these bolts 52, as shown in FIG. 7 in an expanded state, anchor members 66 each having a female screw hole 64 to receive the tip of the bolt are adhered to the upper face 34b of the ceramic plate 34 with adhesive.

The anchor members 66 are made of an electrically insulating synthetic material. By the adhesion of the anchor members 66, the anchor portions 66 into which the tips of the bolts 52 are to be screwed are formed on the upper face 34b of the probe base plate 18a which is the upper face of the ceramic plate 34. The top faces of the respective anchor portions 66 are aligned on the same plane P2 parallel to the imaginary plane P in a free state of the probe base plate 18a with the above-mentioned bending deformation maintained. Consequently, the respective anchor portions 66 have different heights according to the height positions where the anchor portions 66 of the probe base plate 18a with bending deformation are provided.

In the wiring base plate 14, a through hole 70 for receiving a spacer member 68 is formed, penetrating in the thickness direction of the wiring base plate 14 in correspondence to each anchor portion 66. Each bolt 52 is disposed with its head portion 52a positioned on the side of the supporting member 12 to penetrate the spacer member 68, and the tip of the shaft portion 52b is screwed into the female screw hole of the corresponding anchor portion 66.

The spacer members 68 have an equal height dimension to each other. The lower end of each spacer member 68 abuts the top face on the plane P2 of the corresponding anchor portion 66, and the upper end of each spacer member 68 abuts the underside 12a of the supporting member 12 which acts as the mounting reference plane. For this reason, by fastening the bolts 52 from above the supporting member 12, the probe base plate 18a is surely supported on the supporting member 12 with the bending deformation maintained so that the imaginary plane P may become parallel to the mounting reference plane 12a of the supporting member 12 by spacing action of the anchor portions 66 into which the bolt tips are screwed and the spacer member 68 disposed on each anchor portion.

Consequently, since the tips of the probes 18b of the probe assembly 18 are assembled into the electrical connecting apparatus 10 such that the tips of the probe 18b of the probe assembly are aligned on the plane P1 parallel to the imaginary plane P, the tips of all the probes 18b can be aligned on the same plane P1 without such a complicated flattening work of the probe base plate as heretofore. Therefore, it is possible to press the tips of the probes 18b corresponding to the respective connecting pad 26a of the semiconductor wafer 26, so that an electrical test of the electric circuit of the semiconductor wafer 26 which is a device under test can be conducted properly and easily.

Also, as clearly shown in FIG. 7, in order to align the tips of the probes 18b, it is possible to make the height dimensions of the probe lands 40 projecting in the direction to be gradually away from the ceramic plate 34 of the probe base plate 18a different according to the bending deformation of the probe base plate 18a. Each probe land 40 is set at a height such that its lower end face is arranged on a plane P3 parallel to the plane P1 according to the bending deformation of the probe base plate 18a. Thus, by arranging the lower end faces of the probe lands 40 on the plane P3, the probes 18b of the same height, i.e., the same length, are secured to each probe land 40, thereby aligning the tips of the probes 18b by using the probes 18b of the same dimension regardless of the bending deformation of the probe base plate 18a.

Consequently, without preparing various kinds of probes having different height dimensions from each other according to the bending deformation of the probe base plate 18a, it is possible to align the tips of the probes 18b on the plane P1 by adhering the probes 18b of a single height dimension on the probe lands 40.

Likewise, by setting the height dimensions of the anchor portions 66 to be equal, while making the height dimensions of the spacer members 68 different, it is possible to assemble the probe assembly 18 with the deformation of the probe base plate 18a maintained. In this case, however, it is necessary to prepare various kinds of spacer members respectively having optimum height dimensions according to the deformation of the probe base plate 18a, so that it is preferable to use the spacer members 68 of an equal length as described above in order to dispense with many kinds of spacer members and to simplify the production of the electrical connecting apparatus 10.

While an example of the bolts 52 inserted from above the supporting member 12 and with their tips screwed into the anchor portions 66 of the probe base plate 18a is given, it is possible, in place thereof, to use bolts (not shown) which penetrate from the underside of the base plate 18a through the probe base plate, the pogo pin block 16a and the wiring base plate 14 to make the bolt tips screwed into the female screw holes formed in the supporting member 12. In this case, in place of the anchor portions 66 and the spacer members 68, spacers having the same height dimension as that of both members 66, 68 are used.

While wiring of a single layer can be used in place of the multi-layered wiring layer 36, it is desirable to use a multi-layered wiring technique in order to arrange the wiring paths 36a at a high density in order to arrange the respective wiring paths 36a for the plural probes 18b.

Also, in the electrical connecting apparatus 10, the supporting member 12 serves to reinforce the wiring base plate 14 held on the underside 12a, while in a test under a high-temperature environment, there is a tendency that the central portion is deformed into a convex shape downward due to the thermal deformation accompanying a temperature rise and weights of the electrical connectors 16 and the probe assembly 18.

Figure 8:
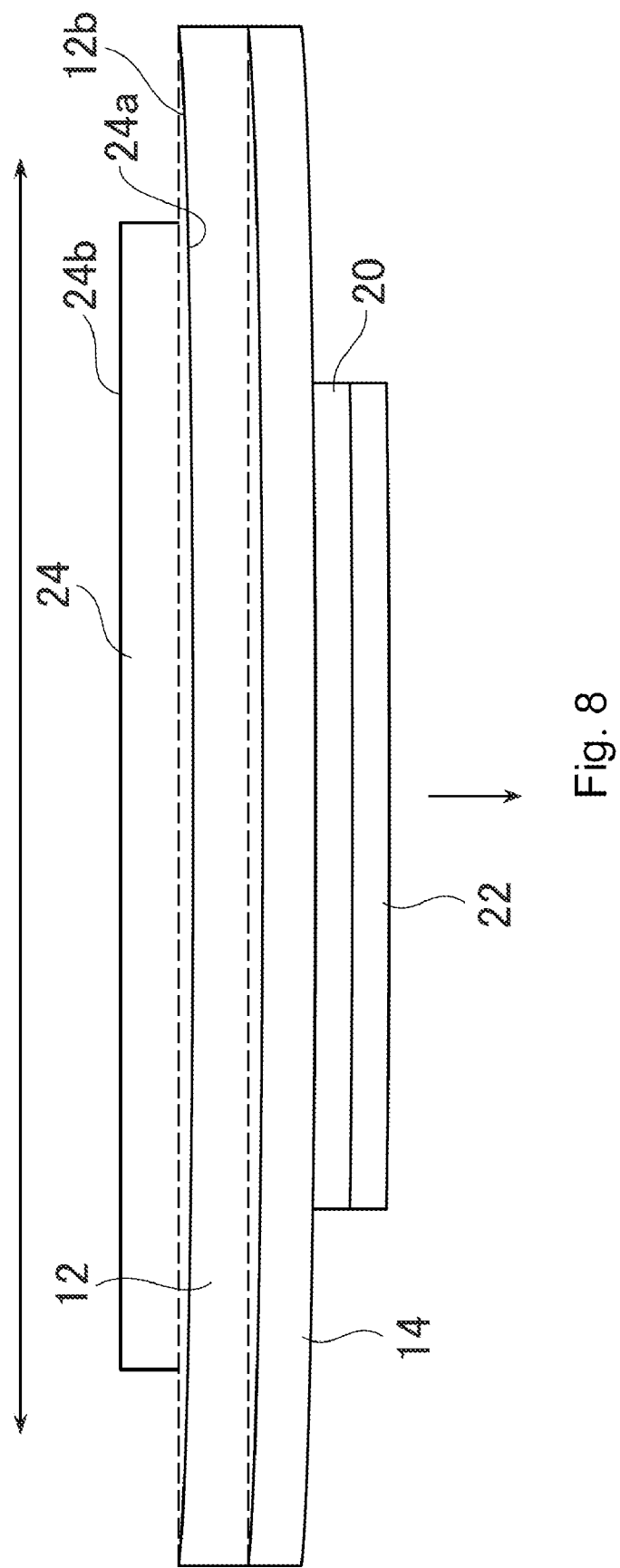
FIG. 8 is a schematic diagram explaining conceptually the action of the thermal deformation inhibitor provided in the electrical connecting apparatus in FIG. 1.

The thermal deformation inhibitor 24, however, abuts the upper face 12b of the supporting member 12 by the bolt 44 (see FIG. 6) and is secured to the supporting member 12. Also, the thermal deformation inhibitor 24 is formed, for example, by aluminum (A5052: coefficient of thermal expansion=23.8 PPM/° C.) which is a metal material with a greater coefficient than the supporting member 12 made of stainless steel (SUS 410: coefficient of thermal expansion=9.9 PPM/° C.). Therefore, under a high temperature environment, as shown in the schematic diagram in FIG. 8, the thermal deformation inhibitor 24 is prone to extend more than the supporting member 12, but its extension is restrained by the supporting member 12 whose underside 24a is smaller in coefficient of thermal expansion than that of the thermal deformation inhibitor 24. For this reason, the upper face 24b which acts as a free plane tends to extend more than the underside 24a subjected to restraint, so that due to the difference in stress the central portion of the free plane tends to generally expand into a convex shape so as to be away from the supporting member. The action force due to this difference in stress acts as force to restrain a downward convex deformation in the central portion of the above-mentioned supporting member 12.

As a result, by installing the thermal deformation inhibitor 24, a downward deflection due to the thermal expansion deformation of the supporting member under a high temperature environment is restrained, thereby restraining a deflective deformation of the probe assembly 18 accompanying this deflection of the supporting member 12.

FIG. 9(a) through FIG. 9(g) show manufacturing processes of the probe assembly shown in FIG. 1.

As the base plate member of the probe base plate 18a for the probe assembly 18, the ceramic plate 34, for example, is prepared. The ceramic plate 34 has a substantially equal thickness generally. Each conductive path 38 as explained along FIG. 5 is formed in this ceramic plate 34. For machining to form these conductive paths 38, a generally sinuate bending deformation is introduced relative to its imaginary plane P. The difference between the lowest part and the highest part in the underside of the ceramic plate 34 due to this deformation proves to be, for example, fifty or sixty μm to 100 μm.

As shown in FIG. 9(b), the multi-layered wiring layer 36 such as one shown in FIG. 5 is formed on one face 34a of the ceramic plate 34 with bending deformation, by utilizing a photolithography as used in a manufacturing process of an integrated circuit. In a predetermined position of the wiring path 36a exposed on the surface of the multi-layered wiring layer 36, the probe lands 40 having an equal height dimension to each other for the probe 18b are formed by the photolithography such as one mentioned above or by electroplating.

The lower end faces of these probe lands 40 are, as shown in FIG. 9(c), aligned on the plane P3 parallel to the imaginary plane P. In order to align the lower end faces of the probe lands 40, a chemical mechanical polish (CMP), for example, is used. This makes the lower end faces of the probe lands 40 align on the plane P3 with an error, for example, less than 10 μm.

As shown in FIG. 9(d), the anchor members 66 made of, for example, a synthetic resin material are secured to predetermined parts of the upper face 34b of the ceramic plate 34. The anchor members 66 have the female screw holes 64 as mentioned above and a height dimension equal to each other. Since the anchor members 66 have the same height, the height positions of the top faces of these anchor portions 66 differ according to the deformation of the ceramic plate 34. The height positions of the anchor portions 66 are, as shown in FIG. 9(e), aligned on the plane P2 parallel to the imaginary flat plane P in the polishing process. In order to align the top faces of the anchor members 66 on the plane P2, a mechanical polish, for example, is used. By this mechanical polish, the top faces of the anchor members 66 are, as in the case of the lower end faces of the probe lands 40, aligned on the plane P2 with an error, for example, less than 10 μm.

It is possible to perform the formation and the polishing process of the anchor portions 66 shown in FIG. 9(d) and FIG. 9(e) before the formation of the probe lands 40 and the multi-layered wiring layer 36 mentioned above.

There is a fear, however, that further bending deformation may be introduced to the ceramic plate 34 while heating in the formation process of the multi-layered wiring layer 36 and the probe lands 40. For surely preventing irregularities of the top faces of the anchor portions 66 due to the bending deformation introduced to the ceramic plate 34 by the formation of the multi-layered wiring layer and the probe lands 40, it is preferable, as shown in FIG. 9(b) through FIG. 9(e), to perform the polishing process of the anchor portions 66 after the formation of the multi-layered wiring layer 36 and the formation and the polishing process of the probe lands 40.

Figure 9:
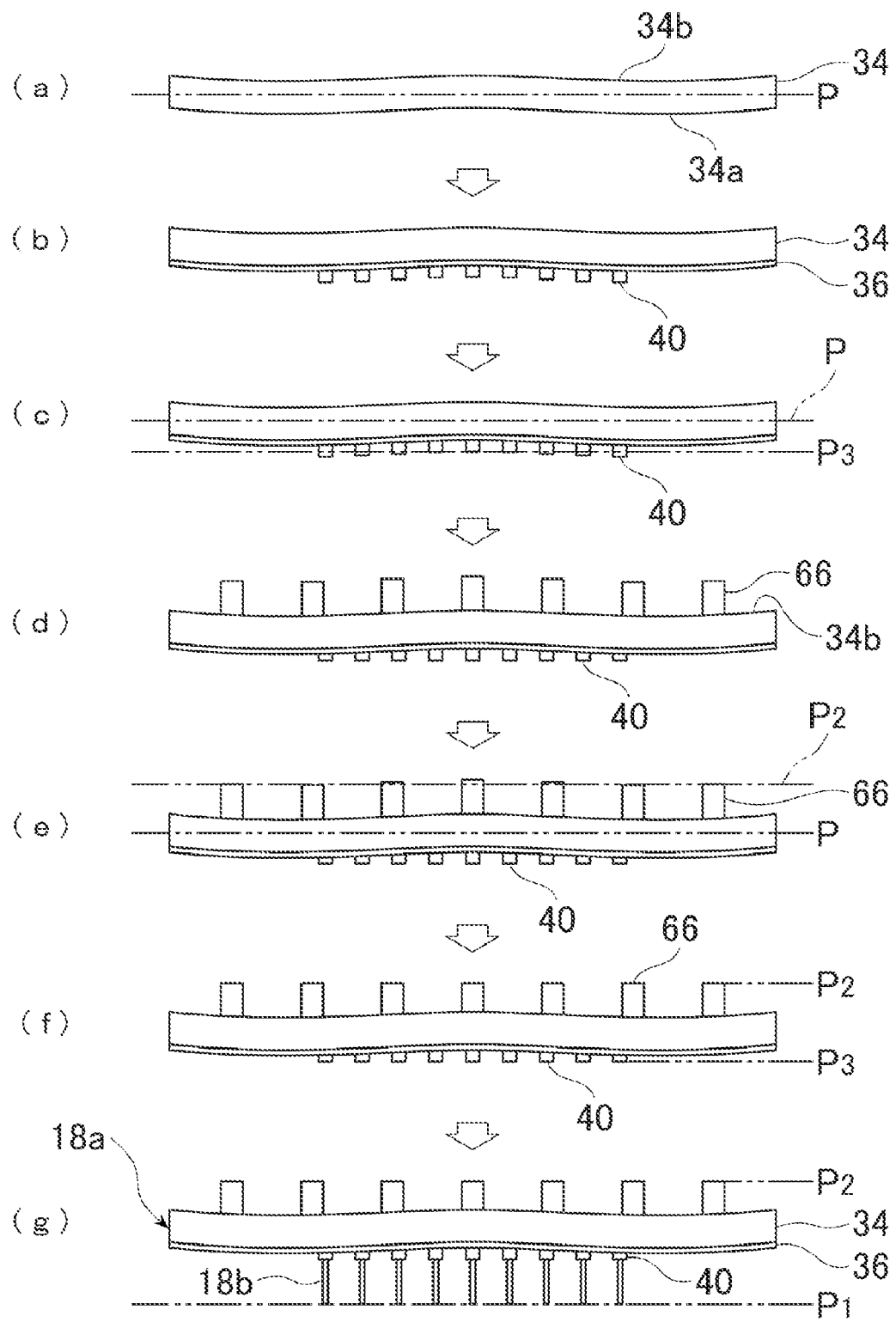

At any rate, by the polish of the probe lands 40 and the polish of the anchor portions 66, as shown in FIG. 9(f), the probe base plate 18a, which has the anchor portions 66 with their top faces aligned on the plane P2 and the probe lands 40 with their end faces aligned on the plane P3, is formed. Accordingly, thereafter, as shown in FIG. 9 (g), the probes 18b of the same length are adhered to the lower end faces of the respective anchor portions 66 by using a conductive adhesive such as solder, thereby forming the probe assembly 18 with the tips aligned on the plane P1, regardless of the bending deformation of the probe base plate 18a.

Since, in the probe assembly 18, the top faces of the anchor portions 66 are aligned on the plane P2, it is possible to align the tips of the respective probes 18b on the same plane P1 within a predetermined allowable error, without adjusting the bending deformation of the probe base plate 18a, by using, for example, the spacer members 68 of the same length formed with an error in height dimension less than 10 μm as well as the bolts 52 to be inserted into the spacer members so as to be supported on the supporting member 12 as mentioned above.

Therefore, without complicated flattening adjustment of the probe base plate 18a, a satisfactory electrical connection between all the probes 18b and the corresponding connecting pads 26a of the electric circuit of the semiconductor wafer 26 can be obtained.

Also, by the above-mentioned manufacturing method, the probe assembly 18 according to the present invention can be relatively easily manufactured.

Other embodiments are shown in FIGS. 10 through 14. In FIGS. 10 through 14, the same reference numerals are put for components having the same function as in the embodiments shown in FIGS. 1 through 9.

Figure 10:
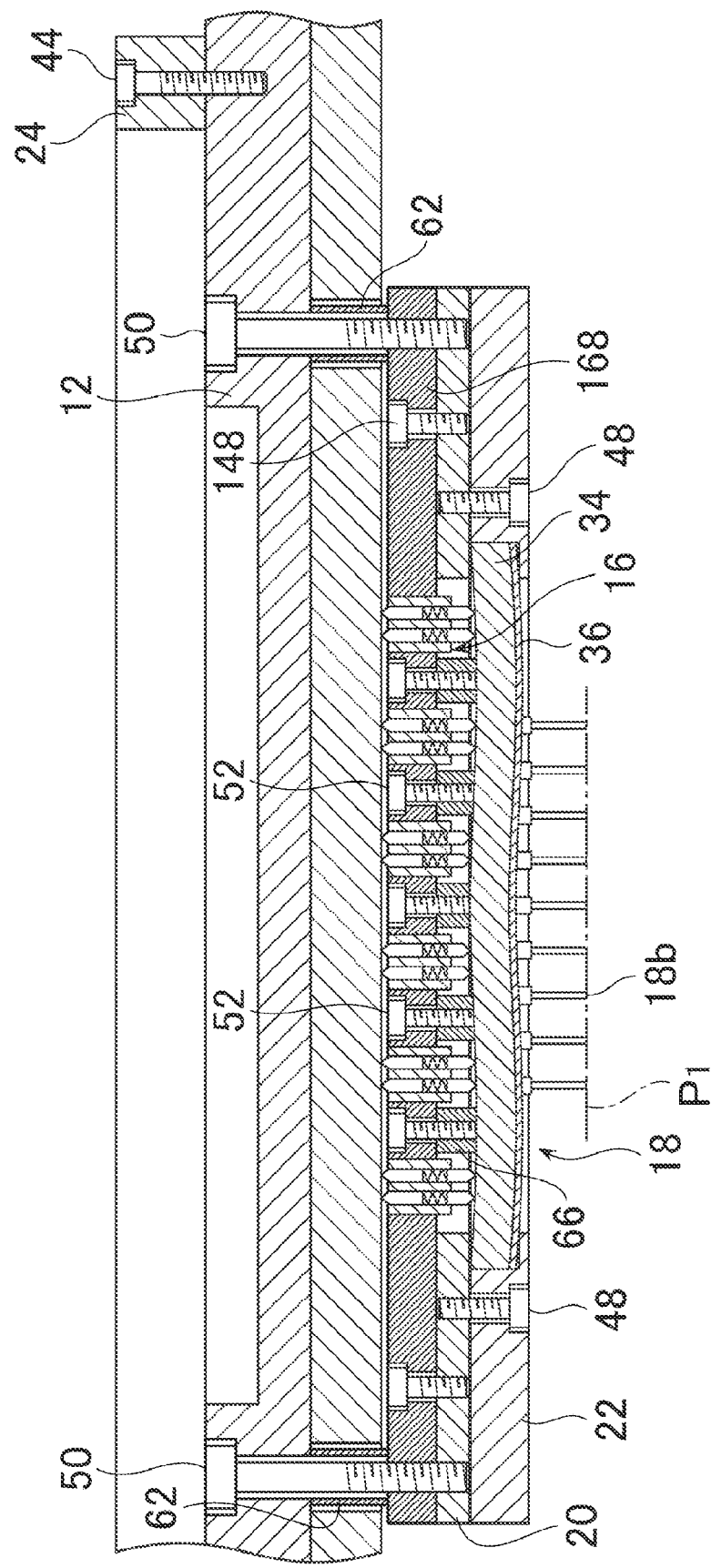
FIG. 10 is a view similar to FIG. 6 showing another embodiment of the electrical connecting apparatus according to the present invention.
Figure 11:
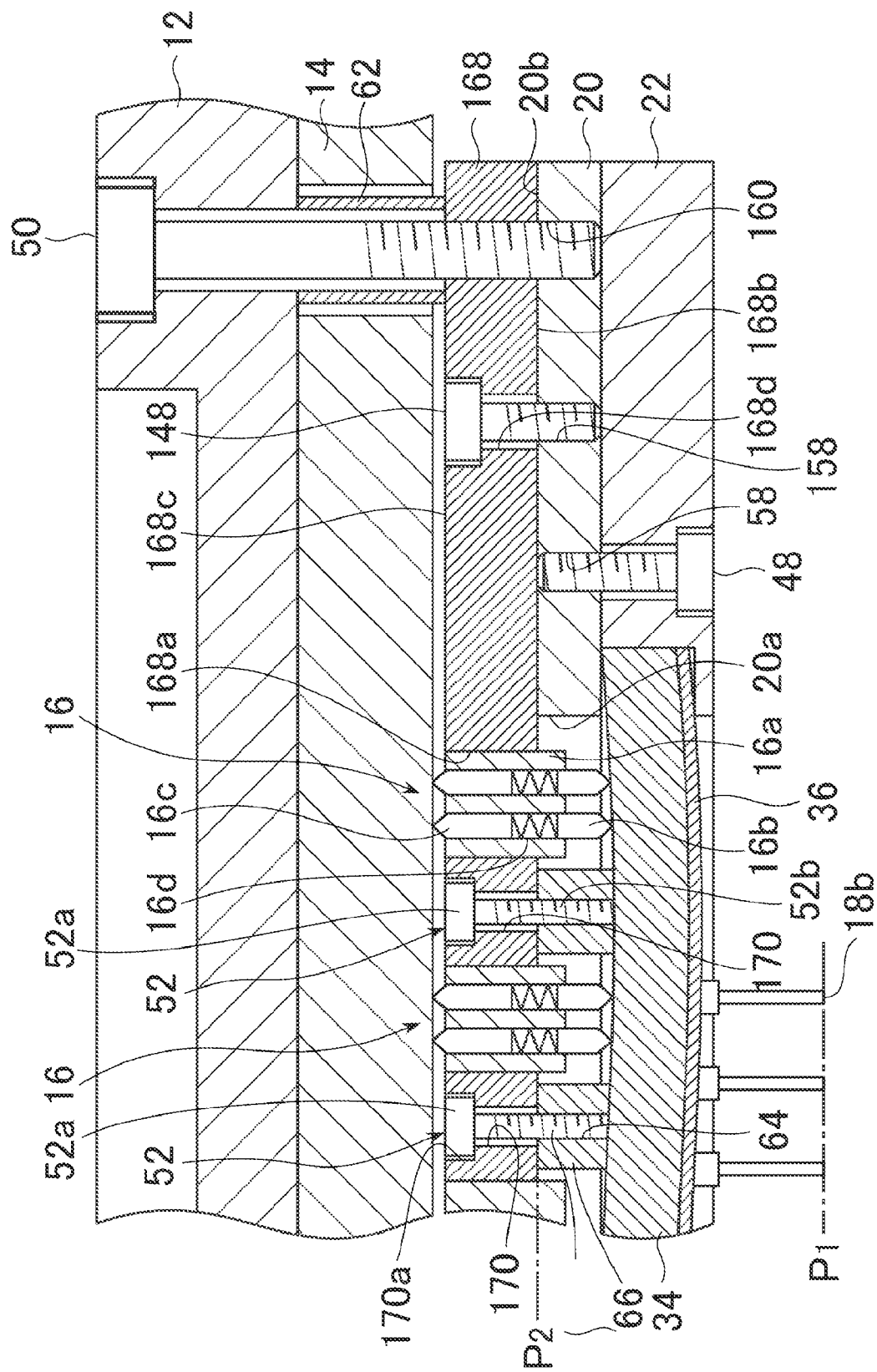
FIG. 11 is a view similar to FIG. 7 showing another embodiment of the electrical connecting apparatus shown in FIG. 10.
Figure 12:
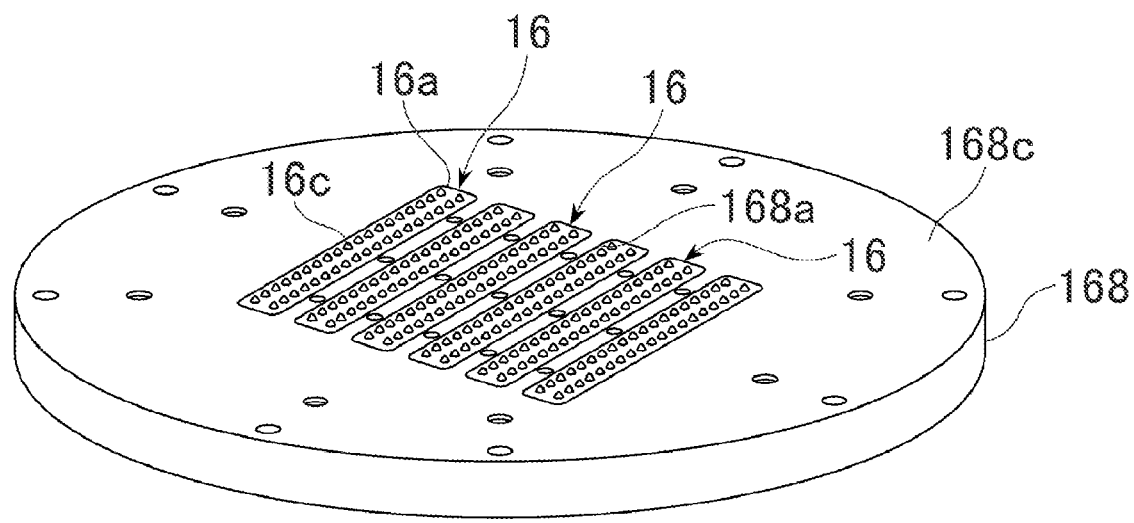
FIG. 12 is a perspective view, seen from above, of the spacer into which the electrical connectors shown in FIG. 10 is assembled.
Figure 13:
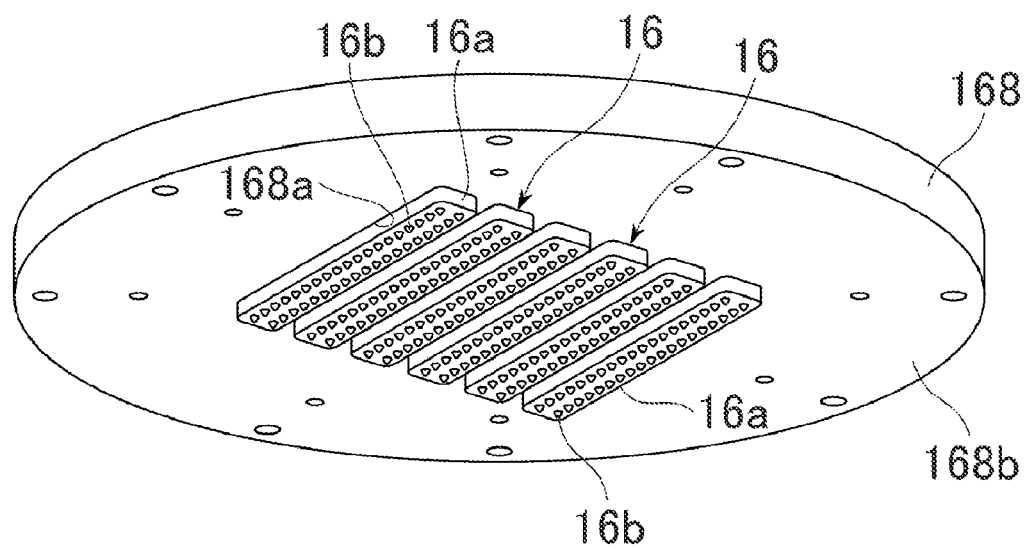
FIG. 13 is a perspective view, seen from below, the spacer into which the electrical connectors shown in FIG. 10 is assembled.

In the examples shown in FIGS. 10 and 11, the probe assembly 18 itself is identical with the one in the above-mentioned embodiments, while the modes of attachment to the supporting member 12 relative to the electric connectors 16 differ from those shown in FIGS. 6 and 7. That is, in the examples shown in FIGS. 10 and 11, a space plate 168 having a uniform thickness dimension is disposed between the wiring base plate 14 and the base ring 20. In the space plate 168, as shown in FIGS. 12 and 13, a plurality of openings 168a penetrating in the thickness direction of the plate are formed for receiving a plurality of electrical connectors 16. Each electrical connector 16 has, as shown in FIG. 11, a pogo pin block 16a such as one mentioned above, the pair of pogo pins 16b, 16c and the helical coil spring 16d for giving eccentric force to the pairs of pogo pins 16b, 16c. The pogo pin block 16a of each electrical connector 16 is inserted into the corresponding opening 168a. By this insertion, the pogo pin 16b of each pair of pogo pins 16b and 16c can be projected, as shown in FIG. 13, from the underside 168b of the space plate 168. Also, the other pogo pin 16c can be projected, as shown in FIG. 12, from the upper face 168c of the space plate 168.

The space plate 168 is secured between the wiring base plate 14 and the base ring 20, as shown clearly in FIG. 11, such that each one pogo pin 16b abuts the connecting portion 38a (see FIG. 5) on the ceramic plate 34 by a bolt 50 screwed into the female screw hole 160, while the other pogo pin 16c abuts the connection terminals 14c of the wiring base plate 14 (see FIG. 5). The distance between the underside 12a of the supporting member 12 and the upper face 168c of the space plate 168 is defined by the spacer 62.

Also, the base ring 20 which sandwiches the edge portion of the probe base plate 18a in cooperation with the securing ring 22 is secured to the space plate 168 with the bolt 148. The bolt 148 is inserted into a through hole 168d from the upper face 168c of the space plate 168, and its tip is screwed into the female screw hole 158 of the base ring 20. The securing ring 22 is connected with the base ring 20 with the bolt 48 such as in the example mentioned above.

Also, in the space plate 168, a through hole 170 is formed to permit penetration of the shaft portion 52b of the bolt 52 to be screwed into the corresponding anchor portion 66 of the probe base plate 18a, while in the upper face 168c of the space plate 168, a recess 170a for accommodating the head portion 52a of the bolt 52 is formed to correspond to each through hole 170.

Therefore, in advance of combining the space plate 168, into which the electrical connectors 16 are assembled, with the supporting member 12 by means of the bolt 50, it is possible to screw the bolt 52 into the female screw hole 64 of the anchor portion 66 through the through hole 170 of the space plate 168 and fasten the bolt 52 so that the top face of the head 52a can be completely accommodated in the recess 170a without projecting from the recess 170a. With respect to the fastening of the bolt 52, the anchor portions 66 and the space plate 168 function as spacers for keeping the deformation of the probe base plate 18a. The fastening of the bolt 52, therefore, enables to hold the probe assembly 18 on the space plate 168 into which the electrical connectors 16 are assembled, with the proper electrical connection between the electrical connectors 16 and the probe assembly 18 maintained. Consequently, by combining the space plate 168 on which the probe base plate 18a is mounted with the supporting member 12 by means of the bolt 50, it is possible to properly support the probe base plate 18a on the supporting member 12 through the space plate 168 with the deformation of the probe base plate 18a maintained.

As a result, since the tips of all the probes 18b can be aligned on the same plane P1 without complicated flattening work of the probe base plate such as heretofore, the electrical test of the electric circuit of the semiconductor wafer 26 which is a device under test can be properly and easily carried out.

Figure 14:
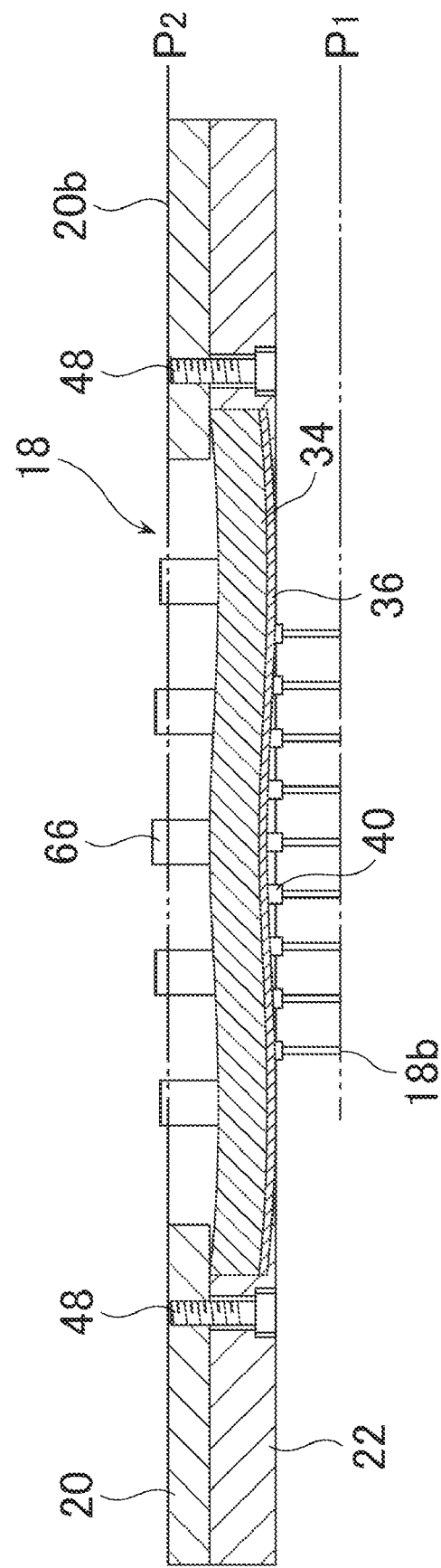
FIG. 14 is a sectional view showing a method of producing the probe base plate of the electrical connecting apparatus shown in FIG. 10.

Also, as clearly shown in FIG. 11, in the example of using the space plate 168, the height positions (the plane P2) of the top faces of the anchor portions 66 coincide with the upper face 20b of the base ring 20 which abuts the underside 168b of the space plate 168. Therefore, as shown in FIG. 14, by combining both rings 20 and 22 by means of the bolt 48 so that the base ring 20 and the securing ring 22 may sandwich the edge portion of the probe base plate 18a of the probe assembly 18, it is possible to use them as holders of the probe assembly 18 in the polishing process of the anchor portions 66 shown in FIG. 9(e) and to use the upper face 20b of the base ring 20 as the reference plane of the top face in the polishing process of the anchor portions 66.

The present invention is not limited to the above embodiments but can be variously modified without departing from its spirit.

What is claimed is:

1. An electrical connecting apparatus for connecting a tester and electrical connection terminals of a device to undergo an electrical test by the tester, comprising:
   a supporting member having a mounting reference plane;
   a wiring base plate in which a wiring circuit to be connected with the tester and disposed such that one face opposes said reference plane of said supporting member, while the other face has a plurality of connection terminals of said wiring circuit;
   a probe assembly having a plate-like probe base plate with bending deformation produced in a free state without load and a plurality of probes which are provided on one face of said probe base plate and whose tips are capable of abutting the connections terminals of the device under test, and the other face of said probe base plate is disposed to oppose the other face of said wiring base plate;
   electrical connectors disposed between said probe base plate and said wiring base plate to connect the connection terminals of said wiring base plate with the probes corresponding to said connection terminals; and a plurality of spacers disposed between the other face of said probe base plate and the reference plane of said supporting member so as to maintain the deformation of said probe base plate;

wherein said probe tips are positioned on the same plane with the deformation of said probe base plate maintained.

2. An electrical connecting apparatus claimed in claim 1, wherein said probe base plate includes a ceramic plate, and a multi-layered wiring layer formed on one face of said ceramic plate and having a plurality of electrical connecting portions on the surface of said multi-layered wiring layer, and wherein said probes are formed in said electrical connecting portions to project in a direction to be away from said ceramic plate.

3. An electrical connecting apparatus claimed in claim 2, wherein a spacer plate having a uniform thickness permitting said electrical connectors to penetrate and combined with said supporting member is disposed between said probe base plate and said wiring base plate, wherein said probe base plate is attached to said spacer plate through a male screw member disposed to penetrate said spacer plate, wherein said spacer includes a plurality of anchor portions formed on the other face of said ceramic plate and rising toward said reference plane, said anchor portions having top faces on the same plane parallel to said reference plane and having female screw holes formed for receiving the ends of said male screw members, and said spacer plate inserted between the top faces of said anchor portions and said reference plane.

4. An electrical connecting apparatus claimed in claim 3, wherein said male screw members are bolts having a head embedded in said spacer member between said wiring base plate and said spacer plate.

5. An electrical connecting apparatus claimed in claim 1, wherein said probe plate is attached to said supporting member through a male screw member disposed to penetrate said supporting member, said wiring base plate and said electrical connector, and wherein said spacer includes:

a plurality of anchor portions formed on the other face of said ceramic plate and rising toward the reference plane of said supporting member, said anchor portions having top faces on the same plane parallel to said reference plane and female screw holes for receiving ends of said male screw members; and a plurality of spacer members inserted between the top faces of said anchor portions and said reference plane and having a uniform length dimension.

6. An electrical connecting apparatus claimed in claim 1, wherein a thermal deformation inhibitor having a greater coefficient of thermal expansion than that of said supporting member on the face opposing said reference plane of said supporting member so as to restrain deflective deformation of said supporting member.

7. A probe assembly for use in electrical measurement of a device under test, comprising a plate-like probe base plate with bending deformation produced in a free state without load, and a plurality of probes formed in one face of said probe base plate to project from the face, wherein each of the probes has a respective probe tip and all probe tips are positioned on the same plane parallel to an imaginary reference plane of said probe base plate with the deformation maintained, wherein a plurality of anchor portions are formed on the other face of said probe base plate for attaching said probe base plate to predetermined positions, and wherein the top faces of all said anchor portions are positioned on the same plane parallel to said imaginary reference plane with the deformation of said probe base plate maintained, wherein said probe base plate includes a base plate member, and a wiring layer formed on one face of said base plate member and having a plurality of electrical connecting portions on the surface of said wiring layer, and wherein said probes are formed in said electrical connecting portions so as to project in a direction to be away from said base plate member, wherein said base plate member of said probe base plate is a ceramic plate, and wherein said anchor portions are formed on the other face of said ceramic plate, said anchor portions having female screw holes respectively for receiving ends of a plurality of male screw members for attaching said probe base plate to said predetermined positions.

8. A probe assembly for use in electrical measurement of a device under test, comprising a plate-like probe base plate with bending deformation produced in a free state without load, and a plurality of probes formed in one face of said probe base plate to project from the face, wherein each of the probes has a respective probe tip and all probe tips are positioned on the same plane parallel to an imaginary reference plane of said probe base plate with the deformation maintained, wherein a plurality of anchor portions are formed on the other face of said probe base plate for attaching said probe base plate to predetermined positions, and wherein the top faces of all said anchor portions are positioned on the same plane parallel to said imaginary reference plane with the deformation of said probe base plate maintained, wherein said probe base plate includes a base plate member, and a wiring layer formed on one face of said base plate member and having a plurality of electrical connecting portions on the surface of said wiring layer, and wherein said probes are formed in said electrical connecting portions so as to project in a direction to be away from said base plate member, wherein said base plate member of said probe base plate is a ceramic plate, wherein said wiring layer is a multi-layered wiring layer, and wherein a plurality of probe lands for said probes are formed in said electrical connecting portions formed on the surface of said multi-layered wiring layer so as to project in a direction to be away from said ceramic plate, wherein each said probe extends from a projecting end face of each said probe land, and wherein said end faces of all said probe lands are positioned on the same plane parallel to said imaginary reference plane of said probe base plate with the deformation maintained.

\* \* \* \* \*